United States Patent [19]
Gross

[11] Patent Number: 4,910,477
[45] Date of Patent: Mar. 20, 1990

[54] BRIDGE-TYPE LINEAR AMPLIFIER WITH WIDE DYNAMIC RANGE AND HIGH EFFICIENCY

[75] Inventor: William H. Gross, Sunnyvale, Calif.

[73] Assignee: Elantec, Milpitas, Calif.

[21] Appl. No.: 329,263

[22] Filed: Mar. 27, 1989

[51] Int. Cl.[4] .............................................. N03F 3/26
[52] U.S. Cl. ................................... 330/263; 330/146; 330/265
[58] Field of Search ................ 330/146, 263, 265, 267, 330/84, 124 R, 295, 310, 311

[56] References Cited

U.S. PATENT DOCUMENTS

| | | | |
|---|---|---|---|
| 3,808,545 | 4/1974 | Stanley | 330/265 |
| 4,528,514 | 7/1985 | Quackenbush | 330/146 |

Primary Examiner—Steven Mottola
Attorney, Agent, or Firm—A. C. Smith

[57] ABSTRACT

A bridge-type linear amplifier includes separate local feedback networks on each half-side channel of the amplifier and an additional feedback network between channels of the amplifier in order to correct for differences in current gains of output transistors and requisite drive currents.

1 Claim, 1 Drawing Sheet

BRIDGE-TYPE LINEAR AMPLIFIER WITH WIDE DYNAMIC RANGE AND HIGH EFFICIENCY

RELATED APPLICATION

The subject matter of this application relates to the subject matter set forth in pending application for U.S. Pat. Ser. No. 329,260, entitled LOW DISTORTION LINEAR AMPLIFIER WITH HIGH-LEVEL OUTPUT, filed Mar. 27, 1989, by William H. Gross.

BACKGROUND OF THE INVENTION

1. Field of the Invention

This invention relates to an improved linear bridge-type amplifier including feedback circuitry for stabilzing gain imbalances, and more particularly, to a bridge-type amplifier in which the amplitude of load signal is limited substantially only by the bias values.

Bridge amplifiers usually include sets of transistors connected in common collector configuration with the base current forming part of the load current. Alternatively, other known bridge amplifiers include sets of transistors connected in common emitter configuration for maximum output signal sensing, but the base current flows to a power supply on the opposite side of the circuit from the load terminals. The transistors for such bridge amplifiers typically are NPN and PNP transistors connected in pairs between power supplies with the load connected between the common collectors of such transistor pairs. Thus, for the bridge amplifier to supply load current, one transistor in each pair must conduct the load current, and two sources of base current for such conducting transistors are required.

2 Summary of the Invention

In accordance with the illustrated embodiment of the present invention, two pairs of complementary conductivity-type transistors form the bridge-type output stages, with the load connected between the common connections of transistors in each pair. Each pair of transistors in the bridge-type output stages are driven by corresponding pairs of complementary conductivity-type driver transistors which are, in turn, driven by independent gain stages in each channel of the amplifier. Local feedback circuits are included around the gain stage in each channel of the amplifier, and a common feedback network across both channels of the amplifier provides overall gain stabilization for load signals with amplitudes that range substantially to the values of power supply bias voltages.

DESCRIPTION OF THE PREFERRED EMBODIMENT

Figure 1:
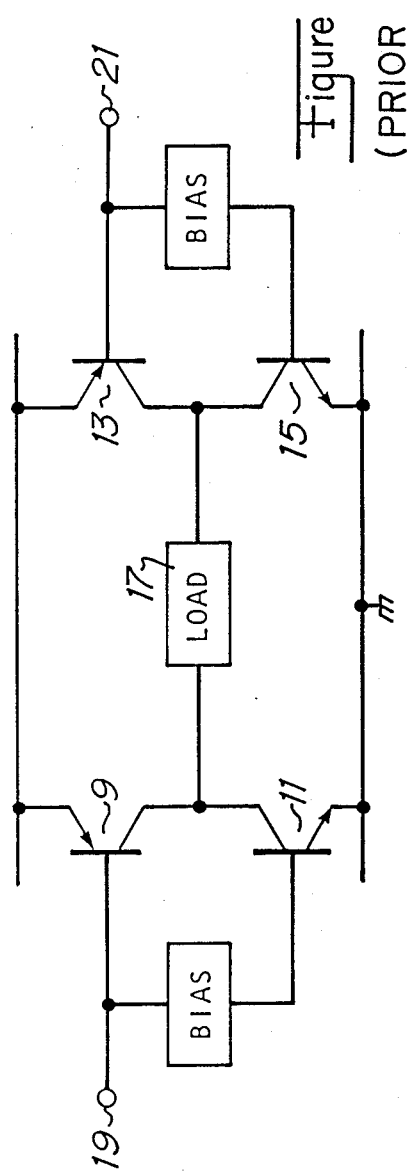
FIG. 1 is a simplified schematic diagram of conventional bridge-type amplifier.

Referring now to the conventional circuitry illustrated in FIG. 1, there are shown two pairs of complementary conductivity-type (NPN and PNP) transistors 9, 11 and 13, 15 arranged on opposite sides of the load 17 to conduct in alternate opposing combinations (9 and 15, 11 and 13) in response to applied signals at the inputs 19, 21. Since the half-side channels of the amplifier may operate substantially independently, separate sources of base current are required for each half-side pair of transistors 9, 11 and 13, 15. Also, feedback or other means are commonly required to overcome the need for additional base current in a transistor with a lower current gain than the corresponding transistor through which the load current must be conducted.

Figure 2:
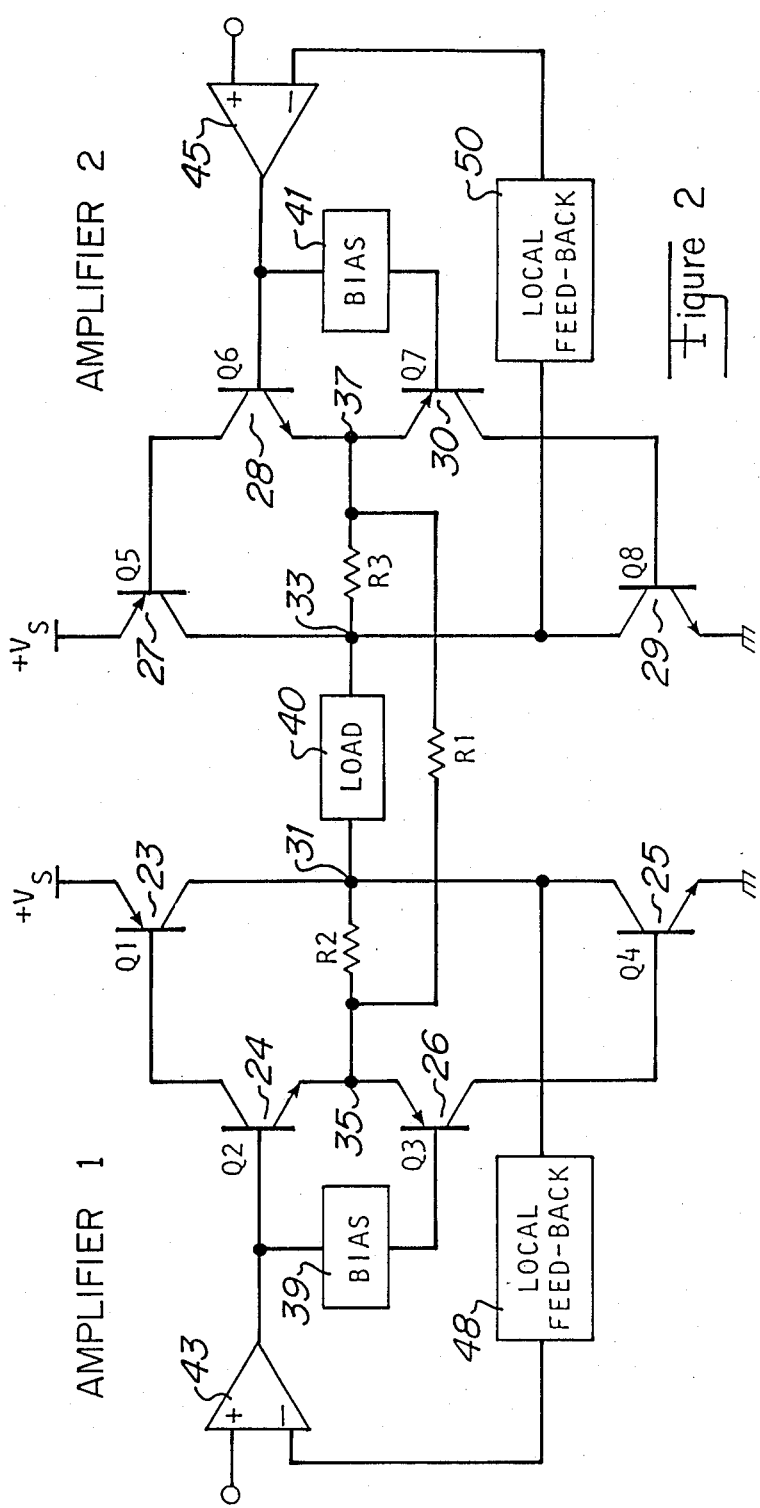
FIG. 2 is a schematic diagram of one embodiment of the present invention.

Referring now to FIG. 2, there is shown a bridge-type linear amplifier circuit including two pairs of complementary-conductivity type output transistors 23, 25 and 27, 29 connected effectively in common emitter configuration with the collectors thereof in each pair forming one load terminal 31, 33 on each half-side of the amplifier. Alternatively, each of the transistors 23, 25, 27 and 29 may be replaced by a closely-coupled Darlington pair of transistors for higher current gain on applied signals.

The base of each of the output transistors is connected to the collector electrode of a driver transistor 24, 26, 28, 30 of opposite conductivity-type. The pairs of driver transistors each have their respective emitter electrodes connected in common to form a feedback Node 35, 37 on each side of the amplifier, and have their base electrodes connected via conventional biasing means 39, 41 to receive signal from the output of the respective input gain stage 43, 45. Resistor $R_1$ is connected between the two feedback Nodes 35, 37, and feedback resistors $R_2$ and $R_3$ are connected between respective feedback and output Nodes 35, 35 and 33, 37.

In operation, the base current for output transistor 23 is supplied via driver transistor 24 and the resistor $R_1$ and via driver transistor 30 which supplies the base current for output transistor 29. Similarly, the base current for output transistor 25 is supplied via driver transistor 26 and the resistor $R_1$ and via driver transistor 28 which supplies base current for output transistor 27. Thus, conduction of current through the load 40 is due to the conduction of output transistors 23 and 29 during one-half cycle of applied signal, and is due to the conduction of output transistors 25 and 27 during alternate half cycle of applied signal. The applied signals may be supplied to he base electrodes of each pair of driver transistors 24, 26 and 28, 30 via conventional bias supplies (to maintain at least a base bias voltage difference of about 1.4 volts, or $2 \times V_{be}$ bewween them), and via the input operational gain stages 43, 45. With local feedback networks 48, 50 connected between respective output nodes and operational gain stage inputs, then the base drive current to the output transistors 23, 25, 27 and 29 will be stabilized substantially at the required value. However, by way of example, if the current gain ($\beta$) of the output transistor 23 does not match the current gain of transistor 29 (or $\beta$'s of output transistors 25, 27 do not match), it would appear that insufficient base drive current is available for the transistor with lower current gain. However, in accordance with the present invention, when the current gain of transistor 29 is less than the current gain of transistor 23, the local feedback network 50 causes the voltage on the base electrode of the driver transistor 30 to drop lower and supply additional current to output transistor 29. Also, the local feedback network 48 and the resistors $R_1$ and $R_2$ will cause the voltage on the base electrode of transistor 24 also to lower and reduce the amount of base drive current to output transistor 23, with the result that the level of current conducted in the load 40 is stabilized at a value for which adequate base drive current can be supplied to output transistor 29. The resistors $R_2$ and $R_3$ thus provide local feedback in the output stages in each half- side channel of the amplifier to correct for mismatches in current gains of output transistors that conduct load current together. As noted from the above example, as the voltage on the base electrode (and emitter electrode) of driver transistor 30 drops and the voltage o the base electrode (and emitter electrode) of driver transistor 24 also drops, more feedback current flows in resistor $R_1$ because of the increase in voltage across resistor $R_2$. Of course, it should be understood that similar circuit operation occurs in response to the current gain of output transistor 27 being larger than the current gain of output transistor 29.

What is claimed is:

1. An amplifier circuit comprising:

first and second pairs of NPN and PNP output transistors, each pair having base and emitter electrodes and having collector electrodes connected in common to form an output node;

a driver transistor of opposite conductivity-type for each output transistor having a collector electrode connected to the base electrode of the corresponding output transistor and having the emitter electrodes of the pair of driver transistors corresponding to each of said first and second pairs of output transistors connected in common to form a feedback node;

supply means connected to supply bias signals to the emitter electrodes of each of the first and second pairs of output transistors;

first and second gain means, each having signal input and each being connected to supply signal to the base electrodes of said driver transistors corresponding to each of said first and second pairs of output transistors;

first and second feedback means, each connected between an output node and the signal input of the corresponding gain means;

first and second resistor means connected between each of said output nodes and a corresponding feedback node; and third resistor means connected between said feedback nodes.

* * * * *